(12) United States Patent
Eppes

(10) Patent No.: US 9,318,464 B2
(45) Date of Patent: Apr. 19, 2016

(54) VARIABLE TEMPERATURE SOLDERS FOR MULTI-CHIP MODULE PACKAGING AND REPACKAGING

(71) Applicant: David H. Eppes, Driftwood, TX (US)

(72) Inventor: David H. Eppes, Driftwood, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 18 days.

(21) Appl. No.: 13/899,080

(22) Filed: May 21, 2013

(65) Prior Publication Data
US 2014/0346664 A1    Nov. 27, 2014

(51) Int. Cl.
*H01L 23/498* (2006.01)
*H01L 23/48* (2006.01)
*H01L 21/50* (2006.01)
(Continued)

(52) U.S. Cl.
CPC ............... *H01L 24/81* (2013.01); *H01L 22/20* (2013.01); *H01L 24/16* (2013.01); *H01L 24/17* (2013.01); *H01L 24/98* (2013.01); *H01L 25/50* (2013.01); *H01L 22/14* (2013.01); *H01L 24/13* (2013.01); *H01L 25/0657* (2013.01); *H01L 2224/131* (2013.01); *H01L 2224/13082* (2013.01); *H01L 2224/13109* (2013.01); *H01L 2224/13111* (2013.01); *H01L 2224/13116* (2013.01); *H01L 2224/13139* (2013.01); *H01L 2224/13144* (2013.01); *H01L 2224/13147* (2013.01); *H01L 2224/13164* (2013.01); *H01L 2224/13169* (2013.01); *H01L 2224/1601* (2013.01); *H01L 2224/16145* (2013.01); *H01L 2224/16225* (2013.01); *H01L 2224/17181* (2013.01); *H01L 2224/17505* (2013.01); *H01L 2224/81815* (2013.01); *H01L 2225/06513* (2013.01); *H01L 2225/06517* (2013.01); *H01L 2225/06565* (2013.01); *H01L 2924/01322* (2013.01);
(Continued)

(58) Field of Classification Search
CPC ................... H01L 29/06; H01L 29/24; H01L 2924/01082; H01L 2224/81815; H01L 2924/01322; H01L 2224/1308; H01L 24/81; H01L 2224/13116; H01L 24/13; H01L 24/16; H01L 2924/15311; H01L 2224/32245; H01L 24/11; H01L 2224/81801
USPC .................................................. 257/730–745
See application file for complete search history.

(56) References Cited

U.S. PATENT DOCUMENTS 6,897,664 B1   5/2005  Bruce et al.
7,884,633 B2   2/2011  Potok et al.
(Continued)

OTHER PUBLICATIONS

Citralogam; http://www.citralogam.com/diagramsnpballoyphase.html; Dec. 18, 2012; pp. 1-2.
(Continued)

*Primary Examiner* — Howard Weiss
*Assistant Examiner* — Nelson Garces
(74) *Attorney, Agent, or Firm* — Timothy M. Honeycutt

(57) ABSTRACT

Various methods of mounting semiconductor chips on a substrate are disclosed. In one aspect, a method of manufacturing is provided that includes coupling a first plurality of solder interconnect structures to a first semiconductor chip. The first solder interconnect structures have a first melting point. The first semiconductor chip may be tested. If the first semiconductor chip passes the testing, then a second semiconductor chip is coupled to the first semiconductor chip using a second plurality of solder interconnect structures that have a second melting point lower than the first melting point.

13 Claims, 7 Drawing Sheets

(51) Int. Cl.
*H01L 23/02* (2006.01)
*H01L 23/00* (2006.01)
*H01L 25/00* (2006.01)
*H01L 21/66* (2006.01)
*H01L 25/065* (2006.01)

(52) U.S. Cl.
CPC ............... *H01L2924/12042* (2013.01); *H01L 2924/15311* (2013.01)

(56) References Cited

U.S. PATENT DOCUMENTS

| | | | | |
|---|---|---|---|---|
| 7,888,176 | B2* | 2/2011 | Wong et al. | 438/108 |
| 8,472,190 | B2* | 6/2013 | Refai-Ahmed | H01L 23/13 361/704 |
| 8,704,353 | B2* | 4/2014 | Su | H01L 23/3677 257/686 |
| 8,759,962 | B2* | 6/2014 | Su | H01L 21/54 257/686 |
| 2007/0176297 | A1* | 8/2007 | Zohni | 257/777 |
| 2012/0193788 | A1* | 8/2012 | Fu | H01L 21/76898 257/738 |
| 2014/0183723 | A1* | 7/2014 | Ayotte et al. | 257/737 |

OTHER PUBLICATIONS

R. Aaron Falk; *Advanced LIVA/TIVA Techniques*; Proceedings from the 27th International Symposium for Testing and Failure Analysis; Nov. 11-15, 2001; pp. all.

* cited by examiner

VARIABLE TEMPERATURE SOLDERS FOR MULTI-CHIP MODULE PACKAGING AND REPACKAGING

BACKGROUND OF THE INVENTION

1. Field of the Invention

This invention relates generally to semiconductor processing, and more particularly to methods and apparatus for stacking multiple semiconductor devices and packaging the same.

2. Description of the Related Art

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Still another technical challenge associated with stacked semiconductor chips is testing.

A process flow to transform bare semiconductor wafers into collections of semiconductor chips and then mount those semiconductor chips on an interposer or circuit board involves a large number of individual steps. Because the processing and mounting of a semiconductor chip proceeds in a generally linear fashion, that is, various steps are usually performed in a specific order, it is desirable to be able to identify defective parts as early in a flow as possible. In this way, defective parts may be identified so that they do not undergo needless additional processing. If, for example, the first semiconductor chip mounted to a circuit board is revealed to be defective only after several other semiconductor chips are stacked thereon, then all of the material processing steps and the materials associated with the later-mounted chips may have been wasted. Conversely, it is desirable to be able to remove a defective chip from a stack or circuit board without necessarily impacting the integrity of any remaining chip(s).

Many conventional stacked chips are interconnected by way of solder bumps. To non-destructively remove one chip without impacting the viability of the solder bumps associated with a remaining chip is a technical challenge. Furthermore, some types of semiconductor chips may be more prone to post-fabrication faults than others.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes coupling a first plurality of solder interconnect structures to a first semiconductor chip. The first solder interconnect structures have a first melting point. The first semiconductor chip may be tested. If the first semiconductor chip passes the testing, then a second semiconductor chip is coupled to the first semiconductor chip using a second plurality of solder interconnect structures that have a second melting point lower than the first melting point.

In accordance with another aspect of an embodiment of the present invention, a method of manufacturing is provided that includes coupling a first semiconductor chip to a substrate using a first plurality of solder interconnect structures. The first solder interconnect structures have a first melting point. A second semiconductor chip is coupled to the first semiconductor chip using a second plurality of solder interconnect structures. The second solder interconnect structures have a second melting point lower than the first melting point. The second semiconductor chip is tested. If the second semiconductor chip fails the testing, then it is removed from the first semiconductor chip by heating the second solder interconnect structures to or above the second melting point but below the first melting point.

In accordance with another aspect of an embodiment of the present invention, a method of manufacturing is provided that includes coupling a first semiconductor chip to a substrate using a first plurality of solder interconnect structures. The first solder interconnect structures have a first melting point. A second semiconductor chip is coupled to the substrate using a second plurality of solder interconnect structures. The second solder interconnect structures have a second melting point lower than the first melting point. The second semiconductor chip is removed from the substrate by heating the second plurality of solder interconnect structures to or above the second melting point but below the first melting point. The second semiconductor chip is tested.

In accordance with another aspect of an embodiment of the present invention, an apparatus is provided that includes a substrate and a first semiconductor chip mounted on the substrate. A first plurality of solder interconnect structures connect the first semiconductor chip to the substrate. The first solder interconnect structures have a first melting point. A second semiconductor chip is mounted on the substrate. A second plurality of solder interconnect structures connect the second semiconductor chip to the substrate. The second plurality of solder interconnect structures have a second melting point lower than the first melting point.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a multi-chip semiconductor chip device and methods of fabricating the same are described herein. In one arrangement, multiple semiconductor chips are mounted on a substrate, which may be a circuit board, interposer or another semiconductor chip. The chips are mounted with solder interconnect structures that have different melting points so one semiconductor chip may be removed by solder reflow without necessarily impacting the solder interconnect structures of the other semiconductor chip. The removal may be performed before or after testing of the removed semiconductor chip.

Figure 1:
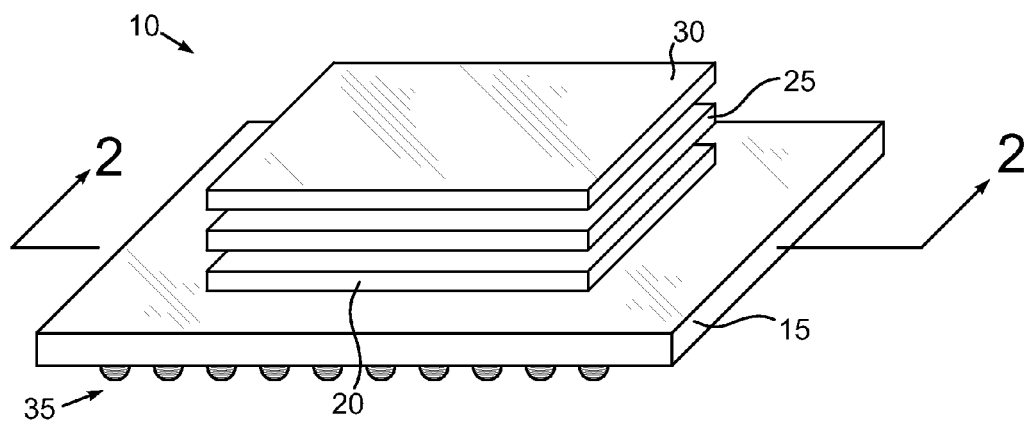
FIG. 1 is a pictorial view of an exemplary embodiment of a semiconductor chip device that may include a circuit board and semiconductor chips stacked thereon.

In the drawings described below, reference numerals are generally repeated where identical elements appear in more than one figure. Turning now to the drawings, and in particular to FIG. 1, therein is shown a pictorial view of an exemplary embodiment of a semiconductor chip device 10 that may include a substrate or circuit board 15 and semiconductor chips 20, 25 and 30 stacked thereon in a so-called 3D stacking arrangement. It should be understood that the semiconductor chips 20, 25 and 30 may number two or more and may be alternatively arranged in a so-called 2.5D or side-by-side arrangement as described in more detail below. Indeed, the circuit board 15 might be fitted with a 3D stack and 2.5D stack arrangements at the same time.

The circuit board 15 may be fabricated in a variety of configurations. Examples include a semiconductor chip package substrate, a circuit card, another interposer, or virtually any other type of printed circuit board. Although a monolithic structure could be used for the circuit board 15, a more typical configuration will utilize a buildup design. In this regard, the circuit board 15 may consist of a central core upon which one or more buildup layers are formed and below which an additional one or more buildup layers are formed. The core itself may consist of a stack of one or more layers. If implemented as a semiconductor chip package substrate, the number of layers in the circuit board 15 can vary from four to sixteen or more, although less than four may be used. So-called "coreless" designs may be used as well. The layers of the circuit board 15 may consist of an insulating material, such as various well-known epoxies, interspersed with metal interconnects. A multi-layer configuration other than buildup could be used. Optionally, the circuit board 15 may be composed of well-known ceramics or other materials suitable for package substrates or other printed circuit boards. The circuit board 15 is provided with a number of electrical pathways to transmit power, ground and signals (not visible). To interface electrically with other devices, the circuit board 15 may be provided with a variety of interconnect structures. In this illustrative embodiment, the circuit board 15 is provided with a ball grid array (BGA) 35. However, the skilled artisan will appreciate that other types of interconnects such as pin grid arrays, land grid arrays or other types of interconnects may be used as desired.

The semiconductor chips 20, 25 and 30 may be virtually any type of integrated circuit. Examples include microprocessors, graphics processors, combined microprocessor/graphics processors sometimes known as accelerated processing units, memory devices, optics devices, application specific integrated circuits or other devices. Any of the semiconductor chips 20, 25 and 30 could be implemented as interposers. Exemplary materials include silicon, germanium, graphene, silicon-on-insulator, or other suitable integrated circuit substrate materials.

The semiconductor chip 20 is electrically connected to the circuit board 15 by way of plural interconnect structures, which are not visible in FIG. 1, but which will be shown in subsequent figures. The semiconductor chip 25 is interconnected electrically with the underlying semiconductor chip 20 and the semiconductor chip 30 is interconnected electrically with the underlying semiconductor chip 25 by way of respective plural interconnect structures, which are similarly not visible in FIG. 1, but will be shown in subsequent figures.

Figure 2:
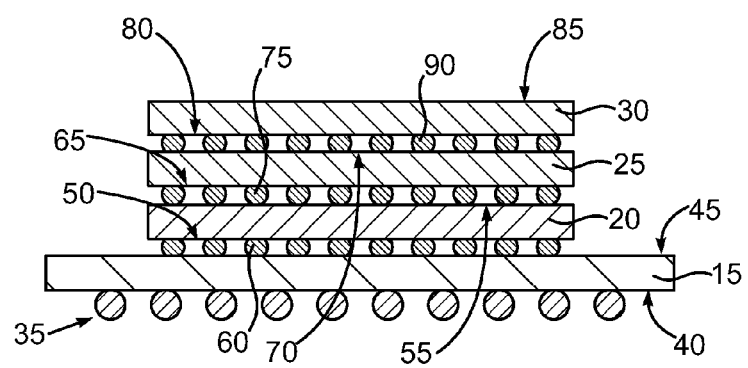
FIG. 2 is a sectional view of FIG. 1 taken at section 2-2.

Additional details of the semiconductor chip device 10 may be understood by referring now to FIG. 2, which is a sectional view of FIG. 1 taken at section 2-2. The BGA 35 is disposed on an underside 40 of the circuit board 15. The semiconductor chip 20 is mounted on an upper side 45 of the circuit board 15. The semiconductor chip 20 has a so-called front side 50 that faces the circuit board 15 and a back side 55. As noted above, the semiconductor chip 20 is interconnected electrically with the circuit board 15 by way of plural interconnect structures, which in this illustrative embodiment may consist of plural solder bumps or joints 60. The semiconductor chip 25 similarly includes a front side 65 and a back side 70 and plural interconnect structures 75 positioned between the front side 65 and the back side 55 of the semiconductor chip 20 to electrically connect with the semiconductor chip 20 and/or the circuit board 15. These interconnect structures 75 may be solder bumps or joints. Finally, the semiconductor chip 30 has a front side 80 facing the semiconductor chip 25 and a back side 85. The semiconductor chip 30 may be interconnected electrically to underlying structures, such as semiconductor chip 25 and/or the circuit board 15 by way of plural interconnect structures, which may be plural solder bumps or joints 90 in this illustrative embodiment. The interconnect structures 60, 75 and 90 may be composed of various types of solders that have selected melting temperatures and perhaps other mechanical properties that facilitate the removal of one or more of the semiconductor chips 20, 25 and 30 without necessarily producing a liquification or otherwise weakening of the interconnect structures for the other chips. For example, the interconnect structures 60 may be composed of a solder that has the highest melting point relative to the melting points of the interconnect structures 75 and 90. The interconnect structures 75 and 90 may be composed of the same types of solders and thus have the same melting points or have stratified melting temperatures such that either the interconnect structures 70 or the interconnect structures 90 has the lower of the two melting points. In this way, a reflow may be performed at a temperature sufficient to liquify, for example, the interconnect structures 75 and thus allow the semiconductor chips 25 and 30 to be lifted off while leaving in place the semiconductor chip 20 so that diagnostics may be performed on the semiconductor chip 20 or the semiconductor chips 25 and 30. This preferential lift off may also be performed in circumstances where a diagnostic has determined that one or more of the semiconductor chips 25 and 30 is found to be defective in some way. Thus, the chips 25 and 30 may be removed without impacting the integrity of the semiconductor chip 20 and its interconnection to the circuit board 15 so that fresh semiconductor chips may be stacked on the semiconductor chip 20 in a reworking operation.

The following table lists some exemplary solders and melting temperatures.

| Solder | Melting Point (Deg. F.) |
|---|---|
| Sn 96.5% Ag 3% Cu 0.5% | 461 |
| Pb 33% Sn 67% | 361 |
| Pb 50% Sn 50% | 401 |
| Pb 60% Sn 40% | 446 |
| In 52% Sn 48% | 244.4 |

These represent just a few examples as the skilled artisan will appreciate that there are many types and compositions of solders. While it is desirable to select a high melting point solder for those interconnects associated with a semiconductor chip that is unlikely to be lifted off, such as the interconnects 60 for the semiconductor chip 20, and conversely to select a lower melting point solder for interconnects associated with a semiconductor chip more likely to require lift off, such as the interconnects 75 for the semiconductor chip 25, the melting point differential may be chosen to be high enough to permit some "super heating" (i.e., heating above the melting point) of the lower temperature solder so that after heat application stops there is enough time to pull away the critical interface while the lower melting point solder is still in a molten state. For example, selecting Sn 96.5% Ag 3% Cu 0.5% for the interconnects 60 and Pb 33% Sn 67% for the interconnects 75 yields a 100° F. melting point differential, which leaves plenty of budget for super heating the interconnects 75. Phase diagrams, which describe melting point and the degree of plasticity of a solder alloy as a function of temperature and percentages of solder alloying elements may be useful in selecting solder composition tailored to achieve a desired melting point.

Of course, it should be understood that solder melting point is not the only design consideration. If the solder interconnects to be melted exhibit a significant plastic state, then lift off may produce plastic deformation of the interconnects and lead to residual solder fragments. These solder residuals may interfere with subsequent processing and/or testing of the formerly joined semiconductor chips. Accordingly, the desired melting point of the lower temperature solder should result in enough liquification to prevent a plastic state, which is more likely to leave residuals on the interface surfaces. Eutectic solders such as 63% Sn 33% Pb have little or no plastic state and thus the liquid state facilitating vacuum or wicking removal. As a consequence, eutectic solders in general will be well suited for the lower temperature application. Additional secondary considerations such as solidification rate, fracture toughness, development of tin dendrites, and solder integrity during temperature cycling testing may factor into any choice of solder.

Figure 3:
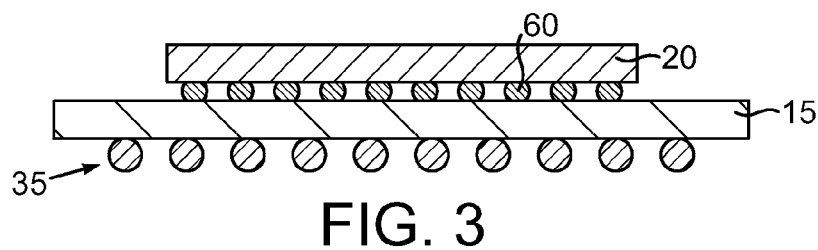
FIG. 3 is a sectional view depicting exemplary mounting of semiconductor chip on a substrate or circuit board.
Figure 4:
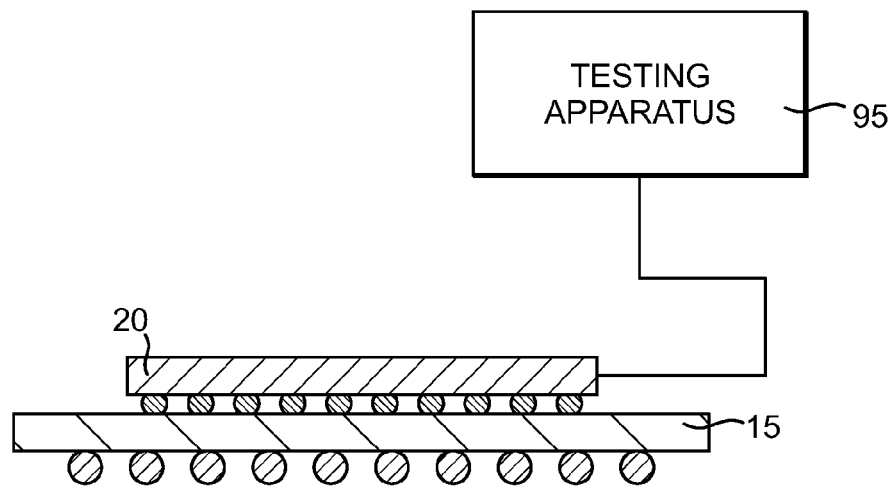
FIG. 4 is a sectional view like FIG. 3, but schematically depicting exemplary testing of the semiconductor chip.

An exemplary method for assembling the semiconductor chip device 10 may be understood by referring now to FIGS. 3, 4, 5, 6, 7 and 8 and initially to FIG. 3. As shown in FIG. 3, the semiconductor chip 20 may be mounted to the circuit board 15 and a reflow performed to temporarily liquify the solder interconnect structures 60 followed by a temperature ramp down to solidify those interconnect structures 60. The requisite heating temperature for this reflow and any other disclosed herein will be dictated by the composition of solder selected for the interconnect structures in question, here the interconnect structures 60. At this point, the BGA 35 may or may not be in position. Consideration will have to be given to the composition of the BGA 35 and whether or not the reflow to connect the semiconductor chip 20 to the circuit board 15 and so on for the other chips will impact the integrity of the BGA 35. For example, one embodiment of the BGA 35 may include solder balls connected to the circuit board 15 by reflowed solder paste. Similar considerations will apply to solder connection for PGA pins. In any event, and as noted above, the interconnect structures 60 may be fabricated from a solder that has a higher melting point than one or both of the semiconductor chips 25 and 30.

Figure 5:
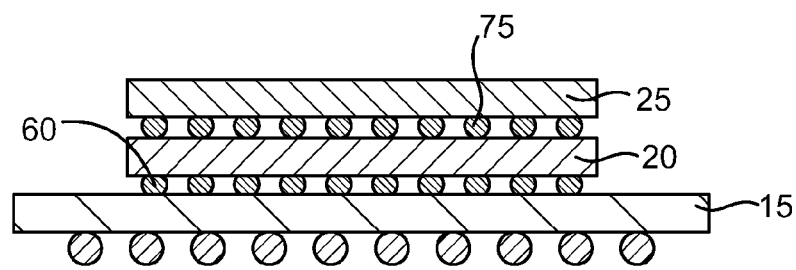
FIG. 5 is a sectional view like FIG. 3, but depicting exemplary mounting of another semiconductor chip on the substrate or circuit board.

Following the mounting of the semiconductor chip 20 to the circuit board 15, the semiconductor chip 20 may undergo a diagnostic or array of diagnostics in order to assess its condition. Such tests may examine the electrical performance, metrology or other characteristics of the semiconductor chip 20, and may similarly examine the electrical performance of the circuit board 15 as well. The diagnostic may be performed by a testing apparatus 95, which is schematically represented in FIG. 5, and may take on a great variety of configurations. Examples include automated testing equipment, laser stimulation, probe testing, metrology measurements or any of the huge variety of different types of diagnostics and may be performed on a semiconductor chip and/or a circuit board. Examples of such soft defect isolation techniques include Thermally Induced Voltage Alteration ("TIVA"), Light Induced Voltage Alteration ("LIVA"), Charge Induced Voltage Alteration ("CIVA") and emission microscopy in visible and other bands. However as just noted, virtually any type of diagnostic test may be performed at this point.

Assume for the purposes of this illustration that the semiconductor chip 20 passes the diagnostic tests performed and thus is eligible to remain connected to the circuit board 15. Then, and as shown in FIG. 5, the semiconductor chip 25 may be stacked on the semiconductor chip 20 and a suitable reflow performed to temporarily liquify the interconnect structures 75 slated to connect the semiconductor chip 25 to the semiconductor chip 20. Since the interconnect structures 75 in this illustrative embodiment are advantageously composed of a solder material with a lower melting point than the interconnect structures 60, this reflow will not impact the integrity of the interconnect structures 60.

Figure 6:
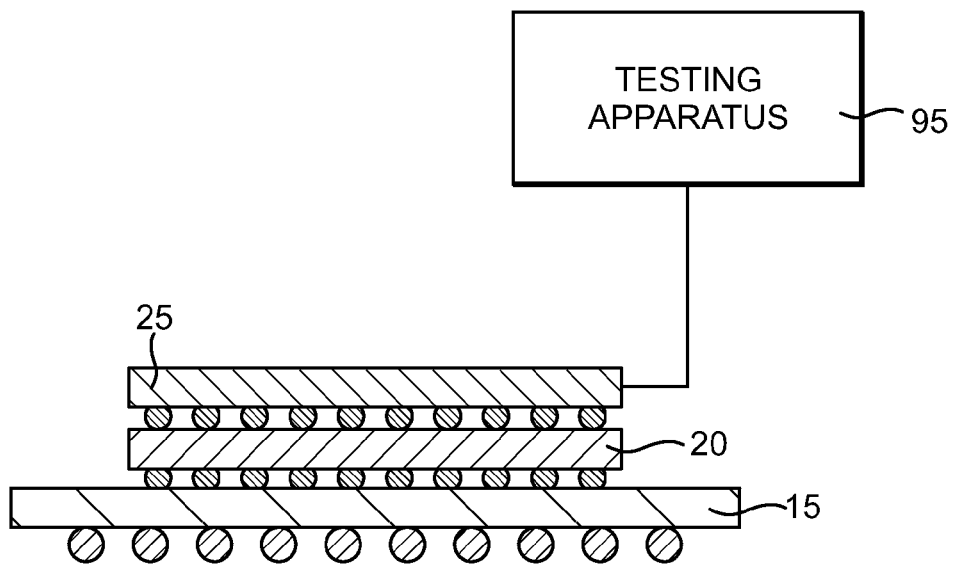
FIG. 6 is a sectional view like FIG. 5, but schematically depicting exemplary testing of the added semiconductor chip.
Figure 7:
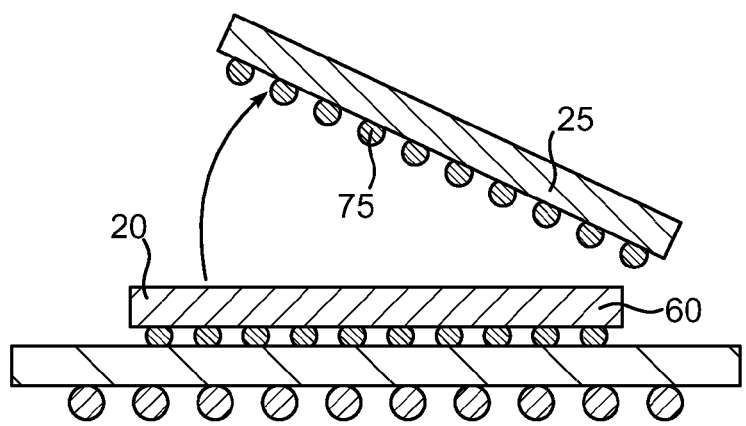
FIG. 7 is a sectional view like FIG. 6, but depicting exemplary removal of the added semiconductor chip.

Next and as depicted in FIG. 6, the semiconductor chip 25 may undergo a diagnostic or series of diagnostic examinations by way of the schematically represented diagnostic tool 95. Again, these diagnostics may take on a large variety of forms described above. Indeed, the diagnostic(s) can also examine the performance and characteristics of not only a semiconductor chip 25 but also the semiconductor chip 20 and again the circuit board 15. Assume for the purposes of this illustration that the diagnostic or diagnostic examination depicted in FIG. 6 reveals that the semiconductor chip 25 is defective. Then, and as depicted in FIG. 7, a reflow at a temperature suitable to liquify the interconnect structures 75 but not sufficient to liquify the interconnect structures 60 may be performed and the semiconductor chip 25 lifted off the semiconductor chip 20. The semiconductor chip 25 thus lifted off may be scrapped or subject to additional diagnostics or even reworked if possible and subsequently reattached to another device.

Figure 8:
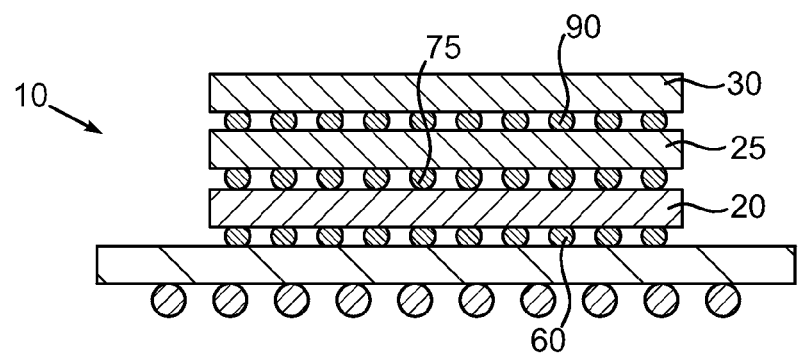
FIG. 8 is a sectional view like FIG. 5, but depicting exemplary mounting of another semiconductor chip on the substrate or circuit board.

FIG. 8 depicts the semiconductor chip device 10 following a successful diagnostic on the semiconductor chip 25 depicted in FIG. 6. At this point, with the semiconductor chips 20 and 25 verified as good parts, the semiconductor chip 30 may be mounted on the semiconductor chip 25 and a reflow performed to temporarily liquify the interconnect structures 90 followed by a cool down to permit solidification. Here, the interconnect structures 90 may be composed of a solder that has a lower melting point than that for the interconnect structures 75 and 60.

Figure 9:
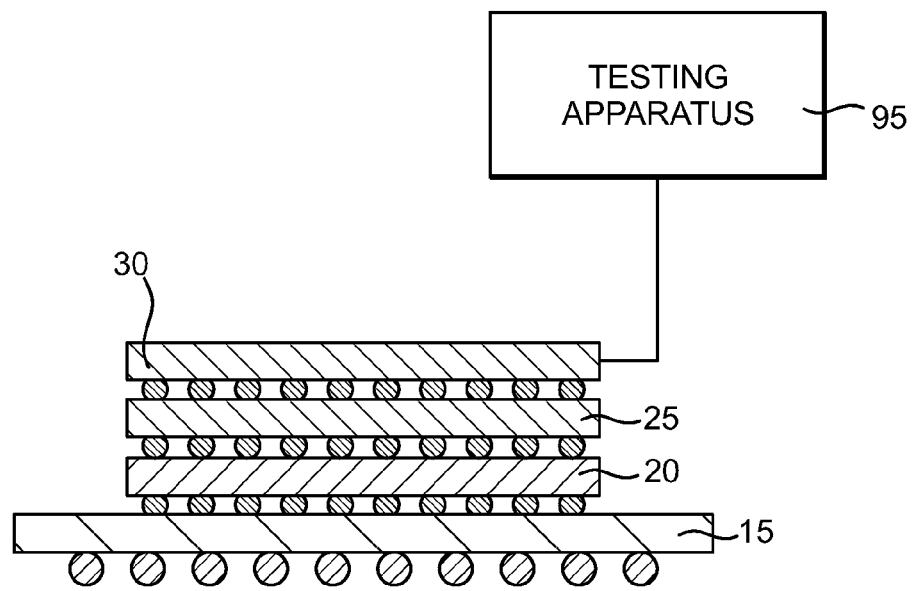
FIG. 9 is a sectional view like FIG. 8, but schematically depicting exemplary testing of the added semiconductor chip.
Figure 10:
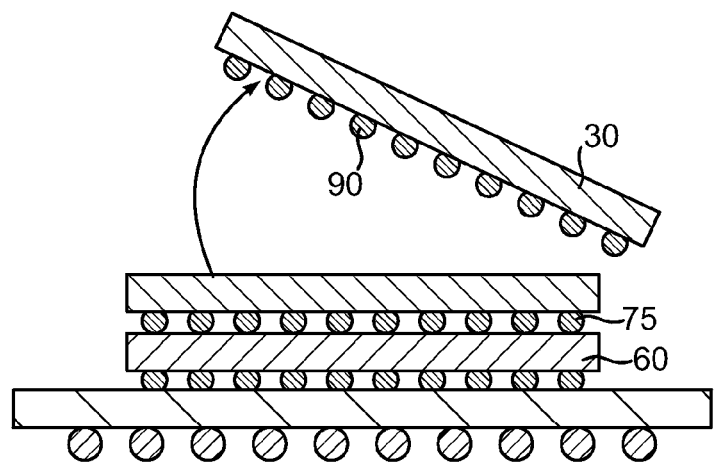
FIG. 10 is a sectional view like FIG. 8, but depicting exemplary removal of the added semiconductor chip.

Thereafter, and as shown in FIG. 9, the diagnostic tool 95 may be used to perform a diagnostic on the semiconductor chip 30 using any of the types of diagnostics described herein and of course the diagnostic may look not only at the semiconductor chip 30 but also the semiconductor chips 25 and 20 and the circuit board 15. If the diagnostic performed as shown in FIG. 9 reveals that the semiconductor chip 30 is defective, then and as shown in FIG. 10, a reflow may be performed to liquify the interconnect structures 90, though not necessarily the interconnect structures 75 or 60, and the semiconductor chip 30 may be lifted off and reworked, scrapped or otherwise processed.

Figure 11:
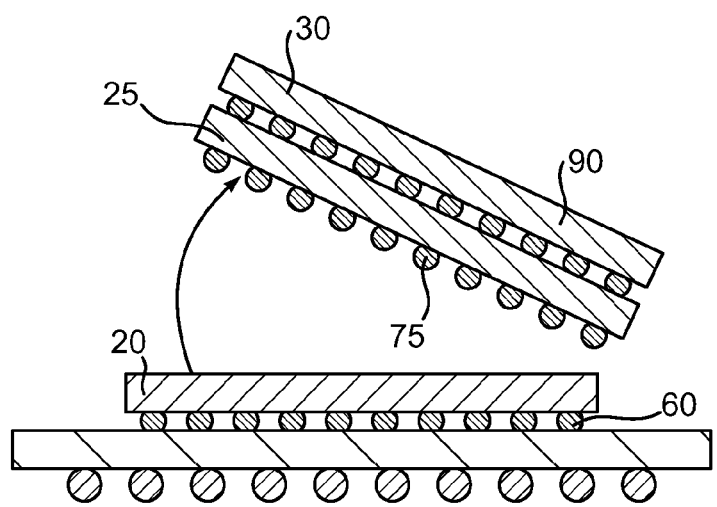
FIG. 11 is a sectional view like FIG. 8, but depicting exemplary removal of some of the added semiconductor chips.

In the foregoing illustrative embodiments, the topmost semiconductor chip, i.e. the semiconductor chip 30 or the semiconductor chip 25, in the stack is removed in a reflow process. However, it should be understood that interconnect structures that have a preferentially low melting point may be used in various places in the stack. For example, and as shown in FIG. 11, the interconnect structures 75 may be formed with the lowest melting point solder in the stack so that a reflow may be performed to liquify those interconnect structures 75 while leaving the interconnect structures 60 and 90 in solid form so that the combination of the semiconductor chips 25 and 30 may be lifted off together from the semiconductor chip 20. This may be desirable in circumstances where it is determined through diagnostics that one or both of the semiconductor chips 25 and 30 is defective or where a later diagnostic determines that the semiconductor chip 20 is defective but the semiconductor chips 25 and 30 are good parts and thus worthy of preservation. The semiconductor chips 25 and 30 could be removed and then reused on another example of the semiconductor chip 20 that is not defective. It should be understood that there are many, many different possible variations of combinations of stacking and solder melting point selection. Indeed, it may be desirable to mount those semiconductor chips that have higher probabilities of physical and/or electrical faults, and thus more likely to require testing or reworking, with lower melting point solder structure interconnects. Flagging a given semiconductor chip as having a higher probability of faults may be done based on manufacturing experience, circuit simulations, the relative circuit complexities of chips and other considerations. Furthermore, the techniques disclosed herein facilitate package preservation, since package reworking is feasible both technically and economically.

Figure 12:
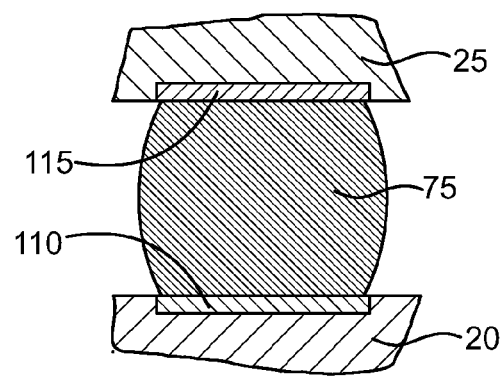
FIG. 12 is a sectional view of an exemplary solder interconnect structure.
Figure 13:
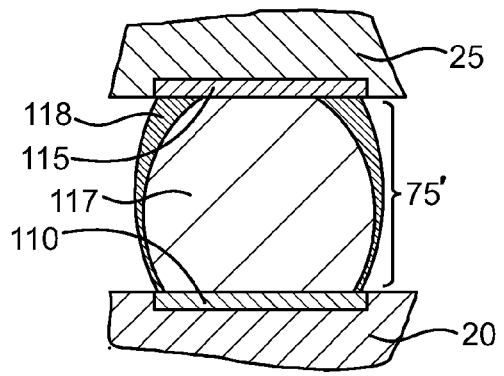
FIG. 13 is a sectional view of an alternate exemplary solder interconnect structure.
Figure 14:
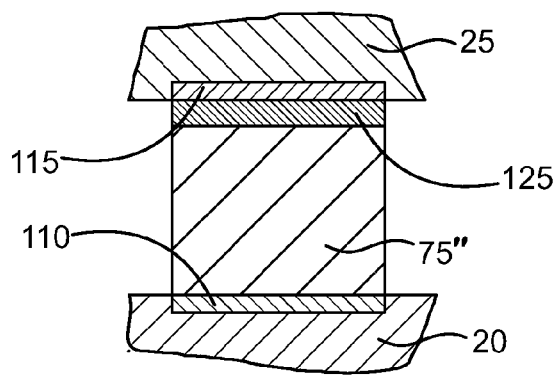
FIG. 14 is a sectional view of an alternate exemplary solder interconnect structure.

FIGS. 12, 13 and 14 depict sectional views of a few exemplary types of interconnect structures that may be utilized in schemes involving stratified solder melting points as described elsewhere herein. FIG. 12 is a sectional view of a small portion of the semiconductor chip 20 and the semiconductor chip 25 and a solder interconnect structure 75 therebetween. The solder interconnect structure 75 may be a solder bump of unitary construction or formed as a joint between two solder structures that are brought together and joined in a reflow process. The interconnect structure 75 may be metallurgically bonded to respective bond pads 110 and 115 of the semiconductor chips 20 and 25. FIG. 13 depicts a sectional view of an alternate exemplary type of interconnect structure 75' consisting of a solder ball 117 enveloped by a reflowed solder paste 118. The interconnect structure 75' may be metallurgically bonded to respective bond pads 110 and 115 of the semiconductor chips 20 and 25. FIG. 14 depicts a sectional view of an alternate exemplary type of interconnect structure 75 "that utilizes solder and may be utilized as described herein. In this illustrative embodiment, the interconnect structure 75" may consist of a copper pillar 120 connected to the bond pad 110 of the semiconductor chip 20. The conductive pillar 120 may be connected by a solder cap 125 that is in turn bonded to the bond pad 115 of the semiconductor chip 25. The conductive pillar 120 may be composed of copper, gold, silver, platinum, palladium or other metals. Again, the solder cap 125 may be composed of the types of solders disclosed herein and utilized in a scheme involving stratified solder melting points for different locations in the stack.

Figure 15:
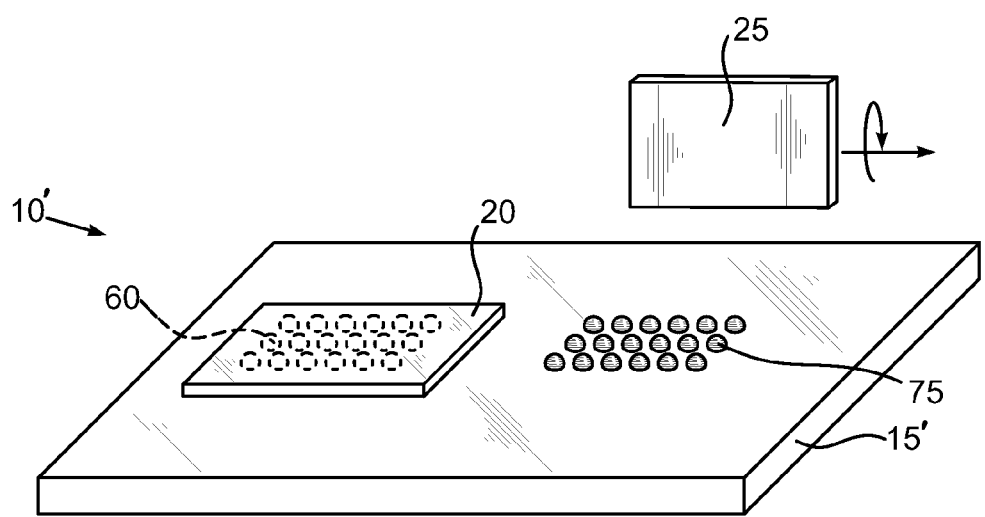
FIG. 15 is a pictorial view of an exemplary embodiment of a semiconductor chip device that may include a substrate or circuit board and semiconductor chips stacked thereon.

As noted briefly above, other than 3D stacking may be implemented using various solders with stratified melting points. As shown in FIG. 15, which is a pictorial view of an alternate exemplary embodiment of a semiconductor chip device 10', a circuit board 15' may be fitted with semiconductor chips 20 and 25 mounted in a 2.5D or side-by-side arrangement. The semiconductor chips 20 and 25 may be connected to the circuit board 15' by way of respective solder structures that have different melting points. In this way, the semiconductor chip 25 may be preferentially removed by performing a reflow that is sufficient to liquify the solder interconnect structures 75 but insufficient to liquify the solder structures 60 that connect the chip 20 to the circuit board 15'.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   coupling a first plurality of solder interconnect structures to a first semiconductor chip, the first plurality of solder interconnect structures having a first melting point;
   coupling a second semiconductor chip to the first semiconductor chip using a second plurality of solder interconnect structures having a second melting point lower than the first melting point; and
   removing the second semiconductor chip from the first semiconductor chip by heating the second plurality of solder interconnect structures to or above the second melting point but below the first melting point.

2. The method of claim 1, wherein the first plurality of solder interconnect structures or the second plurality of solder interconnect structures comprise solder bumps.

3. The method of claim 1, wherein the first plurality of solder interconnect structures or the second plurality of solder interconnect structures comprise conductive pillars.

4. The method of claim 1, comprising testing the first semiconductor chip, and if the first semiconductor chip passes the testing then coupling the second semiconductor chip to the first semiconductor chip.

5. The method of claim 4, comprising mounting the first semiconductor chip to a substrate prior to testing.

6. The method of claim 5, wherein the substrate comprises a package substrate.

7. The method of claim 5, wherein the substrate comprises a third semiconductor chip.

8. A method of manufacturing, comprising:
   coupling a first semiconductor chip to a substrate using a first plurality of solder interconnect structures, the first plurality of solder interconnect structures having a first melting point;

coupling a second semiconductor chip to the first semiconductor chip using a second plurality of solder interconnect structures, the second plurality of solder interconnect structures having a second melting point lower than the first melting point;

testing the second semiconductor chip; and if the second semiconductor chip fails the testing, then removing the second semiconductor chip from the first semiconductor chip by heating the second plurality of solder interconnect structures to or above the second melting point but below the first melting point.

9. The method of claim 8, wherein the first plurality of solder interconnect structures or the second plurality of solder interconnect structures comprise solder bumps.

10. The method of claim 8, wherein the first plurality of solder interconnect structures or the second plurality of solder interconnect structures comprise conductive pillars.

11. A method of manufacturing, comprising:

coupling a first semiconductor chip to a substrate using a first plurality of solder interconnect structures, the first plurality of solder interconnect structures having a first melting point;

coupling a second semiconductor chip to the substrate using a second plurality of solder interconnect structures, the second plurality of solder interconnect structures having a second melting point lower than the first melting point;

removing the second semiconductor chip from the substrate by heating the second plurality of solder interconnect structures to or above the second melting point but below the first melting point; and testing the second semiconductor chip.

12. The method of claim 11, wherein the testing is performed before the second semiconductor chip is removed.

13. The method of claim 11, wherein the testing is performed after the second semiconductor chip is removed.

* * * * *